(12) United States Patent
Yoshimi et al.

(10) Patent No.: US 7,829,457 B2
(45) Date of Patent: Nov. 9, 2010

(54) PROTECTION OF CONDUCTORS FROM OXIDATION IN DEPOSITION CHAMBERS

(75) Inventors: Tatsuya Yoshimi, Oud Heverlee (BE); Rene de Blank, Heverlee (BE); Jerome Noiray, Leuven (BE)

(73) Assignee: ASM International N.V. (NL)

( * ) Notice: Subject to any disclaimer, the term of this patent is extended or adjusted under 35 U.S.C. 154(b) by 0 days.

(21) Appl. No.: 12/390,145

(22) Filed: Feb. 20, 2009

(65) Prior Publication Data

US 2010/0216306 A1 Aug. 26, 2010

(51) Int. Cl.
*H01L 21/00* (2006.01)

(52) U.S. Cl. .................. 438/635; 438/646; 438/648; 438/686; 438/720; 438/778; 257/E21.171; 257/E21.226; 257/E21.274; 257/E21.579; 257/E21.586; 257/E29.017

(58) Field of Classification Search ......... 438/635–648, 438/683–687, 710, 720, 778–786; 257/E21.171, 257/204, 226, 274, 311, 579, 585, 635, 637, 257/E29.017
See application file for complete search history.

(56) References Cited

U.S. PATENT DOCUMENTS

| | | | |
|---|---|---|---|
| 5,008,160 A | 4/1991 | Jenkin | |
| 5,132,756 A | 7/1992 | Matsuda | |
| 5,352,656 A | 10/1994 | Lackey et al. | |
| 5,518,061 A * | 5/1996 | Newkirk et al. | ............... 164/97 |
| 5,545,578 A | 8/1996 | Park et al. | |
| 5,589,421 A | 12/1996 | Miyashita et al. | |

(Continued)

FOREIGN PATENT DOCUMENTS

JP 58-123866 7/1983

(Continued)

OTHER PUBLICATIONS

Audisio, "Chemical Vapor Deposition of Tin on Iron or Carburized Iron," J. Electrochem Soc., Oct. 1980, pp. 2299-2304, vol. 127, Issue 10, Laboratoire de Physicochimie Industrielle, Institut National des Sciences Appliquees de Lyon, Villeurbanne Cedex, France.

(Continued)

*Primary Examiner*—Michael S Lebentritt
(74) *Attorney, Agent, or Firm*—Knobbe, Martens, Olson & Bear, LLP

(57) ABSTRACT

In some embodiments, after depositing conductive material on substrates in a deposition chamber, a reducing gas is introduced into as the chamber in preparation for unloading the substrates. The deposition chamber can be a batch CVD chamber and the deposited material can be a metal nitride, e.g., a transition metal nitride such as titanium metal nitride. As part of the preparation for unloading substrates from the chamber, the substrates may be cooled and the chamber is backfilled with a reducing gas to increase the chamber pressure. It has been found that oxidants can be introduced into the chamber during this time. The introduction of a reducing gas has been found to protect exposed metal-containing films from oxidation during the backfill and/or cooling process. The reducing gas is formed of a reducing agent and a carrier gas, with the reducing agent being a minority component of the reducing gas. By providing a reducing agent, the effects of oxidation on exposed metal-containing films is reduced, therefore enhancing the conductive properties of the metal films.

24 Claims, 4 Drawing Sheets

U.S. PATENT DOCUMENTS

| | | | |
|---|---|---|---|
| 5,756,392 | A | 5/1998 | Lu et al. |
| 5,814,556 | A | 9/1998 | Wee et al. |
| 5,834,068 | A | 11/1998 | Chern et al. |
| 5,872,017 | A | 2/1999 | Boydston et al. |
| 5,916,378 | A | 6/1999 | Bailey et al. |
| 5,985,691 | A | 11/1999 | Basol et al. |
| 6,180,542 | B1 * | 1/2001 | Hwang ............... 438/785 |
| 6,193,911 | B1 | 2/2001 | Hunt et al. |
| 6,204,204 | B1 | 3/2001 | Paranjpe et al. |
| 6,265,297 | B1 | 7/2001 | Powell |
| 6,306,756 | B1 | 10/2001 | Hasunuma et al. |
| 6,310,327 | B1 | 10/2001 | Moore et al. |
| 6,425,951 | B1 | 7/2002 | Chu et al. |
| 6,458,714 | B1 | 10/2002 | Powell et al. |
| 6,500,350 | B1 | 12/2002 | Hunt et al. |
| 6,734,102 | B2 * | 5/2004 | Rathi et al. ............ 438/687 |
| 6,743,473 | B1 | 6/2004 | Parkhe et al. |
| 6,858,524 | B2 * | 2/2005 | Haukka et al. ......... 438/585 |
| 6,890,867 | B2 | 5/2005 | Powell |
| 7,015,151 | B2 | 3/2006 | Powell |
| 7,022,541 | B1 | 4/2006 | Yenilmez et al. |
| 7,129,188 | B2 | 10/2006 | Powell |
| 7,211,508 | B2 * | 5/2007 | Chung et al. ........... 438/633 |
| 7,238,595 | B2 | 7/2007 | Brabant et al. |
| 7,435,665 | B2 | 10/2008 | Airaksinen et al. |
| 2002/0052124 | A1 | 5/2002 | Raaijmakers et al. |
| 2002/0092584 | A1 | 7/2002 | Soininen et al. |
| 2003/0173347 | A1 | 9/2003 | Guiver |
| 2004/0047993 | A1 | 3/2004 | Kumar et al. |
| 2004/0154185 | A1 | 8/2004 | Morad et al. |
| 2006/0115984 | A1 * | 6/2006 | Park et al. ............. 438/648 |
| 2006/0240680 | A1 | 10/2006 | Yokota et al. |
| 2006/0252258 | A1 | 11/2006 | Wu et al. |
| 2007/0259111 | A1 * | 11/2007 | Singh et al. ........... 427/248.1 |
| 2008/0054326 | A1 | 3/2008 | Wong et al. |

FOREIGN PATENT DOCUMENTS

| | | |
|---|---|---|
| JP | 12-04448 | 8/1989 |
| JP | 2001-262378 | 9/2001 |
| WO | WO 93/19222 | 9/1993 |

OTHER PUBLICATIONS

Behner, "Surface composition of CVD-grown a-SiC layers—an XPS and LEED study," Applied Surface Science, May 1996, pp. 27-33, vol. 99, Issue 1.

Champeaux, "In situ growth of YBaCuO superconducting thin films by excimer laser ablation: influence of deposition and cooling parameters," Applied Surface Science, May 1993, pp. 335-339, vol. 69, Issues 1-4.

Frohlich, "Characterization of rare earth oxides based MOSFET gate stacks prepared by metal-organic chemical vapour deposition," Materials Science in Semiconductor Processing, Dec. 2006, pp. 1065-1072, vol. 9, Issue 6.

Galata, "Post deposition annealing studies of lanthanum aluminate and ceria high-k dielectrics on germanium," Microelectronics Reliability, Apr.-May 2007, pp. 532-535, vol. 47, Issues 4-5.

Lu, "A Novel Process for Fabricating Conformal and Stable TiN-Based Barrier Films," J. Electrochem Soc., Dec. 1996, pp. L279-L280, vol. 143, Issue 12, Texas Instruments, Dallas, Texas, United States.

Mori, "Effect of Ambient on the Surface Resistance of Diamond Films during Cooling after Deposition," Japanese Journal of Applied Physics, 1992, pp. L1718-L1720, vol. 31, Osaka University, 2-1 Yamada-oka, Suita, Osaka 565.

Reitmeier, "In situ cleaning of GaN(0001) surfaces in a metalorganic vapor phase epitaxy environment," J. Vac. Sci. Technol., Sep. 2004, p. 2077-2082, vol. 22, Issue 5, North Carolina State University, Raleigh, North Carolina, United States.

Tenne, "Characterization of oriented thin films of WSe2 grown by van der Waals rheotaxy," Thin Solid Films, Jan. 1996, pp. 38-42, vol. 272, Issue 1.

Verrelli, "Deposition and electrical characterization of hafnium oxide films on silicon," Physica status solidi, pp. 3720-3723, vol. 5, Issue 5, Greece.

Yim, "Dependence of the electrical and optical properties of sputter-deposited ZnO: Ga films on the annealing temperature, time, and atmosphere," Journal of Materials Science: Materials in Electronics, Apr. 2007, pp. 385-390, vol. 18, No. 4, Kluwer Academic Publishers, Inha University, Inchon, South Korea.

Chen et al., "Oxidation behavior of titanium nitride films," J. Vac. Sci. Technol. A 23(4), pp. 1006-1009 (Jul./Aug. 2005).

Saha et al., "Titanium nitride oxidation chemistry: An x-ray photoelectron spectroscopy study," J. Appl. Phys. 72 (7), pp. 3072-3079 (Oct. 1, 1992).

Yamamoto et al., "Thermal Stability of Nitrogen in WNx Barriers Applied to Polymetal Gates," J. Vac. Soc. Technol. B. 23(4), pp. 1664-1673 (Jul./Aug. 2005).

* cited by examiner

PROTECTION OF CONDUCTORS FROM OXIDATION IN DEPOSITION CHAMBERS

BACKGROUND

1. Field of the Invention

This application relates generally to semiconductor fabrication and, more particularly, to preventing post-deposition oxidation of metal-containing films.

2. Description of the Related Art

Semiconductor device fabrication is a complex process. Electronic devices are typically formed on a semiconductor substrate, and often include conductive elements separated by insulating elements. Conductive elements may serve as, e.g., electrodes and interconnecting conductors.

Various electronic devices, such as transistor devices, exist in the modern day fabrication of integrated circuits, with metal-oxide-semiconductor field-effect transistors (MOSFET) being a common transistor device. Generally, a MOSFET includes a conductive gate electrode formed over a gate dielectric, which in turn overlies a semiconductor substrate that is typically single-crystal silicon. For reliable performance in electronic devices, such as a MOSFET, it is important to maintain the conductivity of the conductive parts, such as a gate electrode, which may be composed of such conductive materials as metals or metal nitrides.

Accordingly, there is continuing need for processes that produce conductive films with high conductivity or low resistivity.

SUMMARY

According to some embodiments of the invention, a method for producing a transition metal nitride film is provided. A substrate is provided in a chemical vapor deposition (CVD) chamber. A transition metal nitride film is deposited on the substrate in the CVD chamber at a deposition pressure and a deposition temperature. Subsequently, the pressure in the CVD chamber is increased from the deposition pressure to an unloading pressure by flowing a reducing gas into the CVD chamber. The reducing gas comprises an inert gas and a reducing agent. While increasing the pressure in the CVD chamber, the temperature of the substrate is reduced from the deposition temperature to an unloading temperature. The substrate is unloaded from the CVD chamber at the unloading pressure and the unloading temperature.

According to other embodiments of the invention, a method for semiconductor processing is provided. A substrate is provided in a deposition chamber. A conductive film is deposited on the substrate in the chamber at a deposition pressure. The pressure in the CVD chamber is subsequently increased from the deposition pressure to an unloading pressure by flowing a reducing gas into the CVD chamber. The reducing gas comprises an inert gas and a reducing agent. The amount of the reducing agent in the chamber is smaller than the amount of the inert gas. The substrate is unloaded from the chamber at the unloading pressure.

BRIEF DESCRIPTION OF THE DRAWINGS

The application will be better understood from the detailed description and from the appended drawings, which are meant to illustrate and not to limit the application, and wherein.

DETAILED DESCRIPTION

Figure 1:
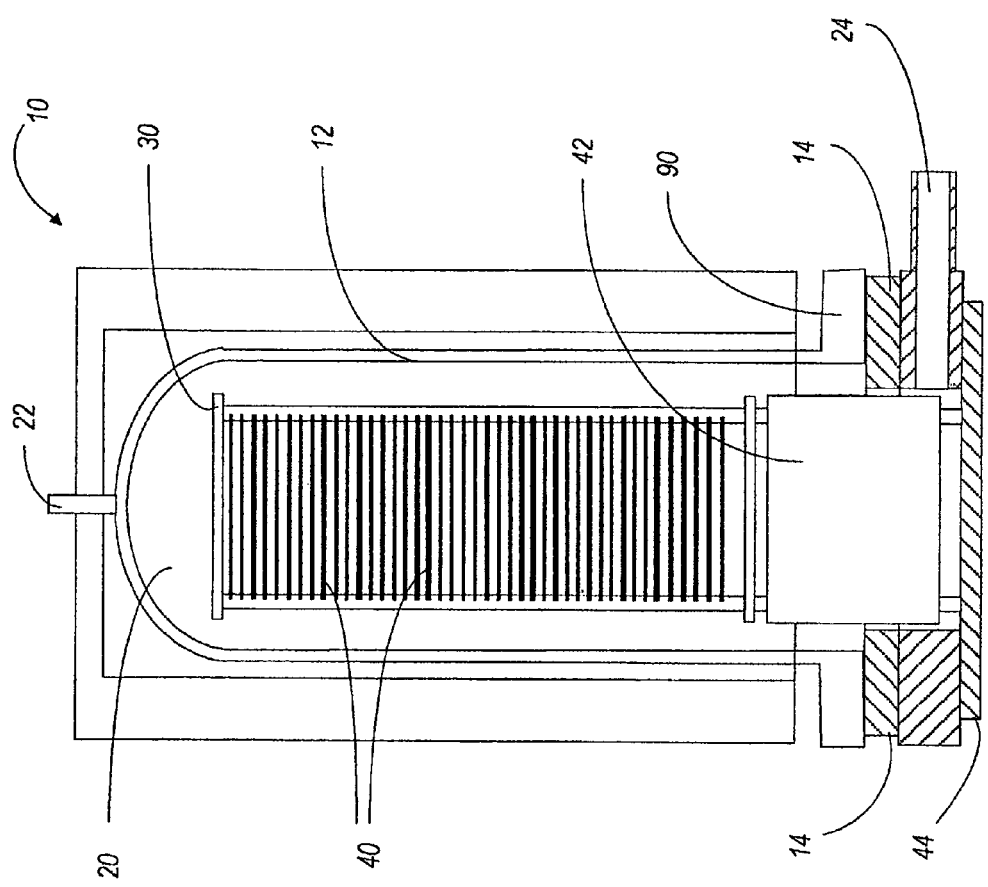
FIG. 1 illustrates a vertical furnace reactor for use with some embodiments of the invention.

The interiors of deposition chambers, such as chemical vapor deposition (CVD) chambers, are highly controlled environments. Temperatures, pressures, and the presence and concentrations of reactive chemical species are closely controlled to achieve a desired process result, such as the deposition of films on substrates in the chamber. Consequently, the gases, including inert gases, flowed into the chamber are generally of high purity.

Depositions typically occur at reduced pressures, e.g., less than 100 Torr, or less than 10 Torr, and at elevated temperatures, e.g., about 450° C. or higher, or about 600° C. or higher. After a deposition process, the chamber may be "backfilled" with gas to bring the chamber pressure up to a level of about atmospheric pressure, suitable for unloading substrates from the chamber. In addition, the chamber and substrate temperatures may also be cooled to a level suitable for unloading the substrates.

The deposition chamber environment remains very controlled during the backfill and cool-down. Inert gases are typically used for the backfill. These gases are conventionally considered to be of high purity, such that undesired oxidation or other reactions would not typically be expected. Nevertheless, it has been found that oxidation occurs and can be problematic. This oxidation occurs even where the deposition in the chamber does not utilize an oxidant, e.g., where a metal or metal nitride is deposited. Without being limited by theory, it is believed that these oxidants may be present in the inert gas source itself, and/or may be picked up from the gas delivery system over the course of flowing the inert gas to the chamber, and/or may be present in the chamber in a residual amount. The presence of oxidants in the inert gas entering the chamber is exacerbated during a backfill, in which a large amount of gas is flowed into the deposition chamber to increase the gas pressure from a near vacuum pressure to about atmospheric pressure. The oxidants cause oxidation of metal-containing materials which can result in undesirable oxygen incorporation and undesirable increases in resistivity in these materials. The oxidation is particularly problematic for thinly deposited films, such as thin metal nitride films, since any oxidized material would make up a larger fraction of a thin film, in comparison to a thicker film. Presently, as the scale of integrated circuits continues to be reduced, such that thinner metal nitride films are becoming increasingly common, these problems with oxidation are becoming magnified.

Advantageously, embodiments of the invention control oxidation during a post deposition unloading process in which a deposition chamber is cooled and/or backfilled. In some embodiments, after depositing a metal-containing film, e.g. a metal nitride film, a reducing gas is used during a subsequent post-deposition backfill/cool down to suppress oxidation of the metal nitride film during the backfill process. The reducing gas includes a reducing agent in a mixture with an inert gas. By providing the reducing agent, the metal nitride film is protected against oxidation and, therefore, maintains desirable conductive properties. In some embodiments, the metal-containing film has a thickness of about 100 nm or less, or about 40 nm or less, or between about 3 nm and about 20 nm.

The reducing agent is a minority component of the reducing gas. Preferably, the reducing agent is a gas and constitutes about 4 volume percent (vol. %) or less of the reducing gas, or about 2 vol. % or less. In some embodiments, the concentration of reducing agent in the reducing gas is in the range of about 0.1 to about 4 vol. %. Advantageously, the reducing gas effectively suppresses oxidation, allowing the resistivity of deposited metal-containing films to be maintained at low levels. Moreover, the reducing gas is "safe" and non-explosive. Thus, the deposition chamber can advantageously be opened and brought into communication with an unloading ambient, and ultimately with a clean room ambient and substrates can be unloaded while the deposition chamber is still filled with the reducing gas, without needing to change the composition of the deposition chamber atmosphere.

Reference will now be made to the figures, in which like numerals refer to like parts throughout. It will be appreciated that the methods disclosed herein for suppressing oxidation during a backfill are applicable to various structures having exposed conductive surfaces, such as metal nitride surfaces, or transition metal nitride surfaces.

With reference to FIG. 1, a reactor for use with some embodiments is illustrated. The reactor 10 is a vertical furnace reactor, which accommodates substrates 40 vertically separated from one another and which has benefits for efficient heating and loading sequences. The substrates can be, e.g., semiconductor substrates, including silicon wafers. In some embodiments, the reactor 10 can accommodate 25 or more, or 50 or more substrates. Examples of suitable vertical furnaces are the A400™ and A412™ vertical furnaces, commercially available from ASM International, N.V. of Almere, the Netherlands. It will be understood, however, that while some embodiments are presented in the context of a vertical batch furnace, the principles and advantages disclosed herein will have application to other types of reactors known, including single wafer reactors.

With continued reference to FIG. 1, a tube 12 defines a reaction chamber 20 in the interior of the vertical furnace or reactor 10. The lower end of the tube 12 terminates in a flange 90, which mechanically seals the chamber 20 by contact with a lower support surface 14. Process gases can be fed into the reaction chamber 20 through a gas inlet 22 at the top of the chamber 20 and evacuated out of the chamber 20 through a gas outlet 24 at the bottom of the chamber 20. The reaction chamber 20 accommodates a wafer boat 30 holding a stack of vertically spaced substrates or wafers 40.

The process tube flange 90 can be maintained at an elevated temperature to avoid condensation of process gases on it. It will be appreciated that the elevated temperature can vary from process to process and is preferably chosen based on the identities of the process gases. Regulation of the temperature of the flange 90 can be achieved by providing it with electrical heaters and a wafer-cooling system. The water-cooling is desired primarily to avoid overheating of the flange 90 during unloading of a batch of hot wafers 40.

Various systems can be used to supply reactants or precursors to the reaction chamber 20. For example, where the precursor is a gas, it can be flowed directly from a gas source to the chamber 20. The timing and rate of the flow of the gas can be controlled by a programmed controller connected to the reactor 10. The controller in turn controls mass flow controllers in a piping system connected to the chamber 20.

Where the precursor is stored as a liquid, a bubbler can be used to supply the precursor to the chamber 20 in gaseous form. The timing and rate of flow of such a precursor can be regulated by controlling the flow of carrier gas through the liquid in the bubbler and by controlling the temperature of the liquid. It will be appreciated that the quality of the liquid precursor carried by the carrier gas increases with increasing temperature.

Process gases can be introduced into the chamber 20 in various ways. For example, in the reactor illustrated in FIG. 1, gases are introduced into the interior 20 of the reactor 10 at the top, via the top inlet 22, and exhausted at the bottom of the reactor 10, via the exhaust 24. In other embodiments, the process gases can be introduced through vertically-extending injectors having an array of vertically-distributed and separated holes.

Figure 2:
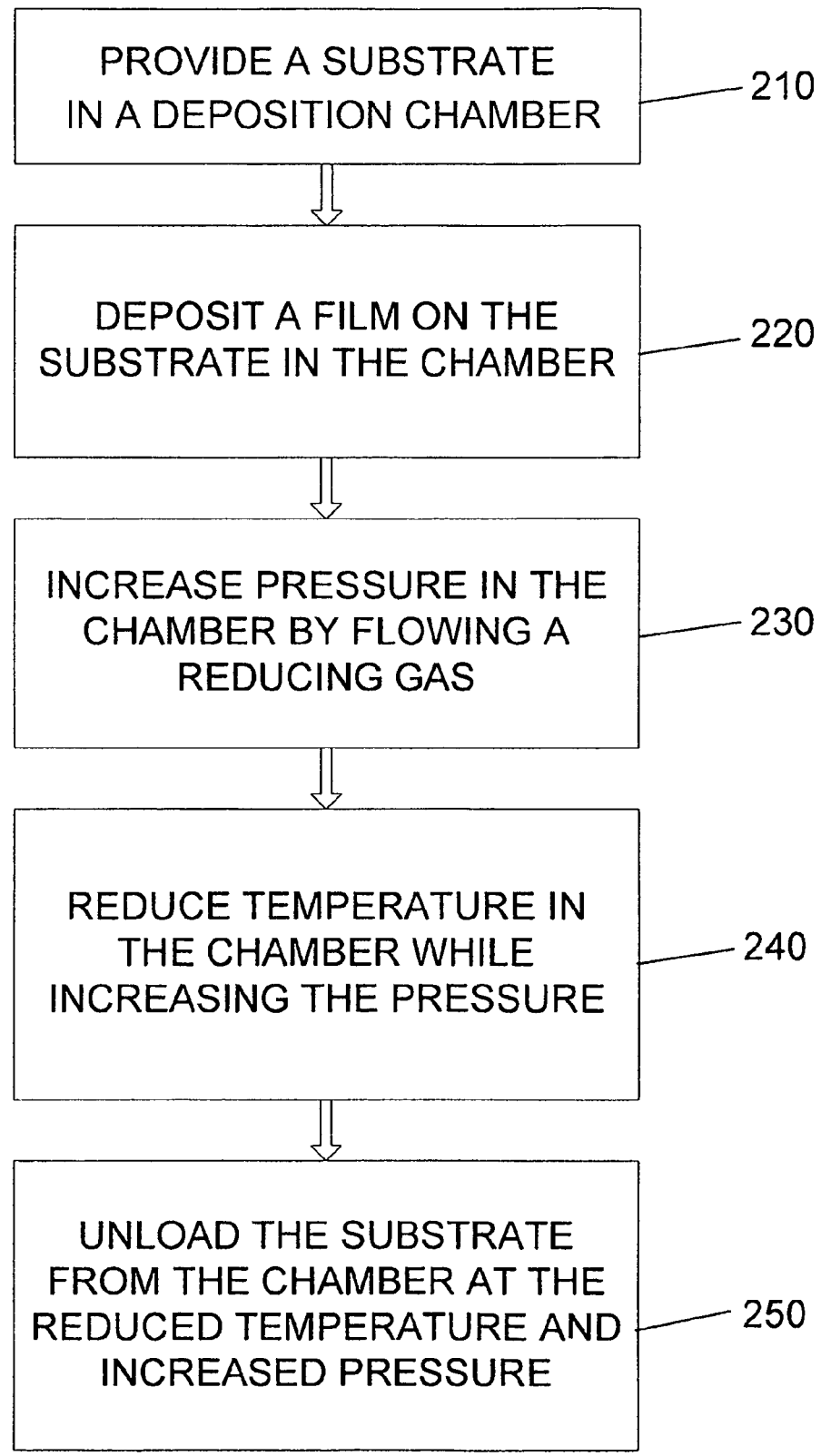
FIG. 2 is a flow chart showing a method of processing a substrate, according to some embodiments of the invention.

With reference to FIG. 2, a flow chart of a method for processing a substrate according to some embodiments is provided. Initially, a substrate is provided 210 in a deposition or reaction chamber. In some embodiments, the chamber can comprise a chamber suitable for low-pressure CVD, pulsed CVD, or plasma-enhanced CVD. The chamber may also be configured to perform atomic layer deposition (ALD) or physical vapor deposition (PVD).

The substrate that is provided 210 in the chamber comprises a workpiece upon which deposition is desired. In some embodiments, the substrate is a single crystal silicon wafer, a semiconductor-on-insulator (SOI) substrate, or an epitaxial silicon surface, a silicon-germanium surface, or a group material deposited on a wafer. Workpieces are not limited to wafers, but also include glass, plastic, or other substrates employed in semiconductor processing. In some embodiments, the substrate comprises a "mixed" substrate having two or more different types of surface morphologies such as, e.g., silicon and insulator regions.

In some embodiments, the substrate that is provided 210 in the deposition chamber comprises a partially fabricated integrated circuit, in which one or more layers are deposited over the substrate. The layers can include dielectric materials, such as silicon dioxide, silicon nitride, metal oxide or metal silicate. The layers can also include conductive material such as polysilicon or various types of metal, including tungsten or titanium, which can be used as gate electrode structures. In some embodiments, a silicon substrate is provided 210 in the CVD chamber with a dielectric layer and a metal-containing layer comprised of titanium nitride formed thereover.

After providing 210 the substrate in the chamber, a film is deposited 220 on the substrate in situ. During deposition, the chamber can be kept at a relatively high temperature (or deposition temperature) of about 350° C. or more, or about 450° C. or more, or about 600° C. or more. To achieve the deposition temperature, in some embodiments, radiant heat sources capable of producing high temperature heat energy are provided outside of the chamber to heat it. In addition, during deposition, the chamber can be kept at a low deposition pressure of about 100 Torr or less, or about 10 Torr or less, or even near a high vacuum pressure of 0 Torr.

In some embodiments, the deposited film comprises a conductor, such as a metal nitride, or transition metal nitride or polysilicon. In a preferred embodiment, the deposited film comprises a metal nitride film such as a transition metal nitride, including, without limitation, tungsten nitride, titanium nitride, titanium silicon nitride, or tantalum nitride. The film can be deposited using, e.g., blanket or selective deposition processes. The final thickness of the film can vary depending on the intended purpose of the film; in some embodiments, a conductive film is deposited that has a thickness of about 100 nm or less, or about 40 nm or less. In some embodiments, the film is deposited by chemical vapor deposition.

With reference to FIG. 2, after depositing 220 the film on the substrate, the gas pressure in the chamber is increased 230 by flowing a reducing gas into the chamber in a backfill process. Flowing the reducing gas increases the pressure in the chamber from the low deposition pressure to a higher pressure suitable for unloading the substrate from the chamber. In some embodiments, the reducing gas comprises hydrogen ($H_2$) gas as a reducing agent. Other suitable reducing agents include alcohols such as methanol, ethanol propanol, isopropyl alcohol, and combinations thereof. The reducing agent is in a mixture with an inert gas, e.g., $N_2$, Ar, He, or combinations of inert gases. Preferably, the reducing agent is a minority component of the reducing gas. For example, in some embodiments, the reducing agent constitutes about 4 vol. % or less of the reducing gas, or about 2 vol. % or less. In some embodiments, the reducing agent constitutes about 0.1 to about 4 vol. % of the reducing gas, or about 0.1 to about 2 vol. % of the reducing gas.

In some embodiments, the reducing agent is introduced into a deposition chamber prior to backfilling, e.g., during a deposition process, and is kept flowing continuously, e.g., with a flow of a carrier gas, into the chamber during the post-deposition backfill process. In embodiments in which the reducing gas flows continuously from the time of a deposition process and through to a post-deposition backfill process, the flow rate of the reducing gas can vary or remain constant. For example, the reducing agent can be at a relatively high concentration during the deposition and then the concentration is reduced, to about 0.1-4 vol. %, or about 0.1-2 vol. % during the backfill.

In some other embodiments, the flow of the reducing gas is initiated after film deposition, and during the post-deposition backfill to increase the pressure in the chamber. Regardless of whether the flow of the reducing gas is initiated during a deposition process or during a post-deposition backfill, in some embodiments, the flow of the reducing gas can continue until the substrate is unloaded from the wafer chamber.

With continued reference to FIG. 2, while increasing 230 the pressure in the chamber, the temperature can also be reduced 240. The temperature can be reduced from the relatively high deposition temperature to a temperature suitable for unloading the processed substrate from the chamber. In some embodiments, the temperature can be reduced by reducing the intensity of heat emitted from radiant heat sources outside of the chamber.

Once the chamber pressure has been increased to an appropriate unloading pressure and the chamber temperature is reduced to an appropriate unloading temperature, the substrate can be unloaded 250 from the chamber. In some embodiments, the unloading pressure is about atmospheric pressure and the unloading temperature is about 400° C. or less, or about 350° C. or less. It has been found that very low unloading temperatures can cause particle generation. In some embodiments, the unloading temperature is set at about 250° C. or higher, or preferably about 300° C. or higher, e.g., in the range between about 300° C. and about 400° C., to prevent this particle generation.

The reducing gas suppresses oxidation of exposed conductors, e.g., metal nitrides, on the substrates. As a result, the conductors have advantageously low resistivities. In some embodiments, the resistivity of the deposited films are about 80 $\mu\Omega$·cm or less, or about 70 $\mu\Omega$·cm or less at film thicknesses of about 10 nm or less. In some embodiments, the resistivity of the metal films are about 70 $\mu\Omega$·cm or less, or 60 $\mu\Omega$·cm or less at film thicknesses of about 20 nm or less.

Figure 3:
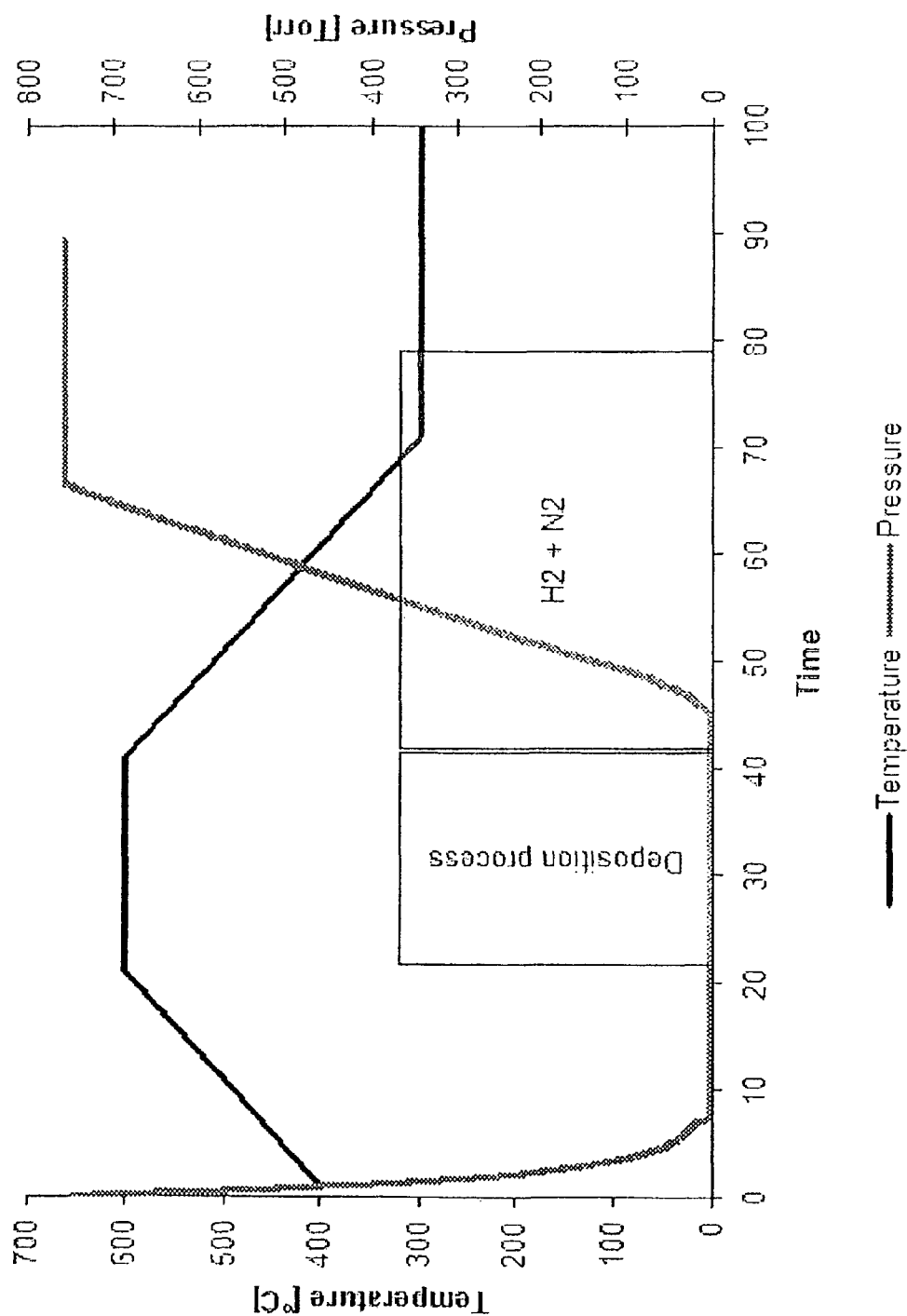
FIG. 3 is a graph illustrating temperature and pressure changes during a deposition and post-deposition backfill process, according to some embodiments of the invention.

FIG. 3 illustrates graphically temperature and pressure changes in a deposition chamber during a deposition and post-deposition backfill and cool-down according to some embodiments. As illustrated, after providing a substrate in a chamber, the chamber is evacuated down to a deposition pressure, e.g., about 10 Torr or less, and the chamber temperature is increased to a deposition temperature, e.g., about 600° C. Once the desired pressure and temperature are attained, a deposition process is performed.

After the deposition process is performed, the chamber is backfilled with a reducing gas to increase the chamber pressure. The reducing gas can be formed of, e.g., $H_2$ and $N_2$, preferably of about 4 vol % $H_2$ in $N_2$ (such a reducing gas may also be referred to as forming gas). Also after the deposition, the chamber and the substrates in it are cooled from the deposition temperature of about 600° C. to the unloading temperature of about 300° C.

Once the chamber pressure and temperature reach desired unloading pressures and unloading temperatures, the chamber can be opened and the substrates can be removed. In some embodiments, the substrates are held vertically-separated on a wafer boat and unloading the substrates includes unloading the wafer boat from the deposition chamber.

With continued reference to FIG. 3, one skilled in the art will appreciate that the time on the x-axis is somewhat arbitrary and neither the deposition process nor the backfill process need be confined to specific durational limits.

Example

The resistivities of titanium nitride films produced under various conditions were analyzed. Titanium nitride films were deposited on substrates in an A412™ CVD batch reactor commercially available from ASM International, N.V. of Almere, the Netherlands. The titanium nitride was deposited by chemical vapor deposition using $TiCl_4$ and $NH_3$ at flow rates of about 2 g/min and 0.2 slm, respectively. The deposition temperature was about 600° C., and the deposition pressure was about 0.2 Torr. Under these conditions, the depositions processes were performed for various durations, resulting in the deposition of titanium nitride films having thicknesses of 10 nm, 20 nm, and 40 nm. The deposited films were subjected to various post-deposition processes and the resistivities of the films were measured, the results of which are presented in FIG. 4.

In all cases, the post-deposition processes included backfilling the deposition chamber to increase the pressure in the chamber to about atmospheric pressure and cooling the substrates to an unloading temperature of 300° C. The post-deposition processes were differentiated as three processes as follows:

(1) A "standard" process in which no reducing agent was provided during post-deposition backfill and no post-deposition anneal was performed. The deposition chamber was simply back-filled with nitrogen gas and the substrates allowed to cool to the unloading temperature.

(2) A process according to some embodiments of the invention, in which a reducing gas was provided during post-deposition backfill. The reducing gas consisted of a mixture of $H_2$ and $N_2$, with the concentration of $H_2$ at 4 vol. % (forming gas).

(3) A standard process in which no reducing agent was provided during post-deposition backfill. In addition to the standard process, the substrates were subjected to an ex-situ post deposition anneal. The ex-situ anneal was performed for thirty minutes at a temperature of about 750° C. in an anneal chamber containing 0.4% $NH_3$, 19.5% $H_2$ and the remainder of the atmosphere being $N_2$.

Figure 4:
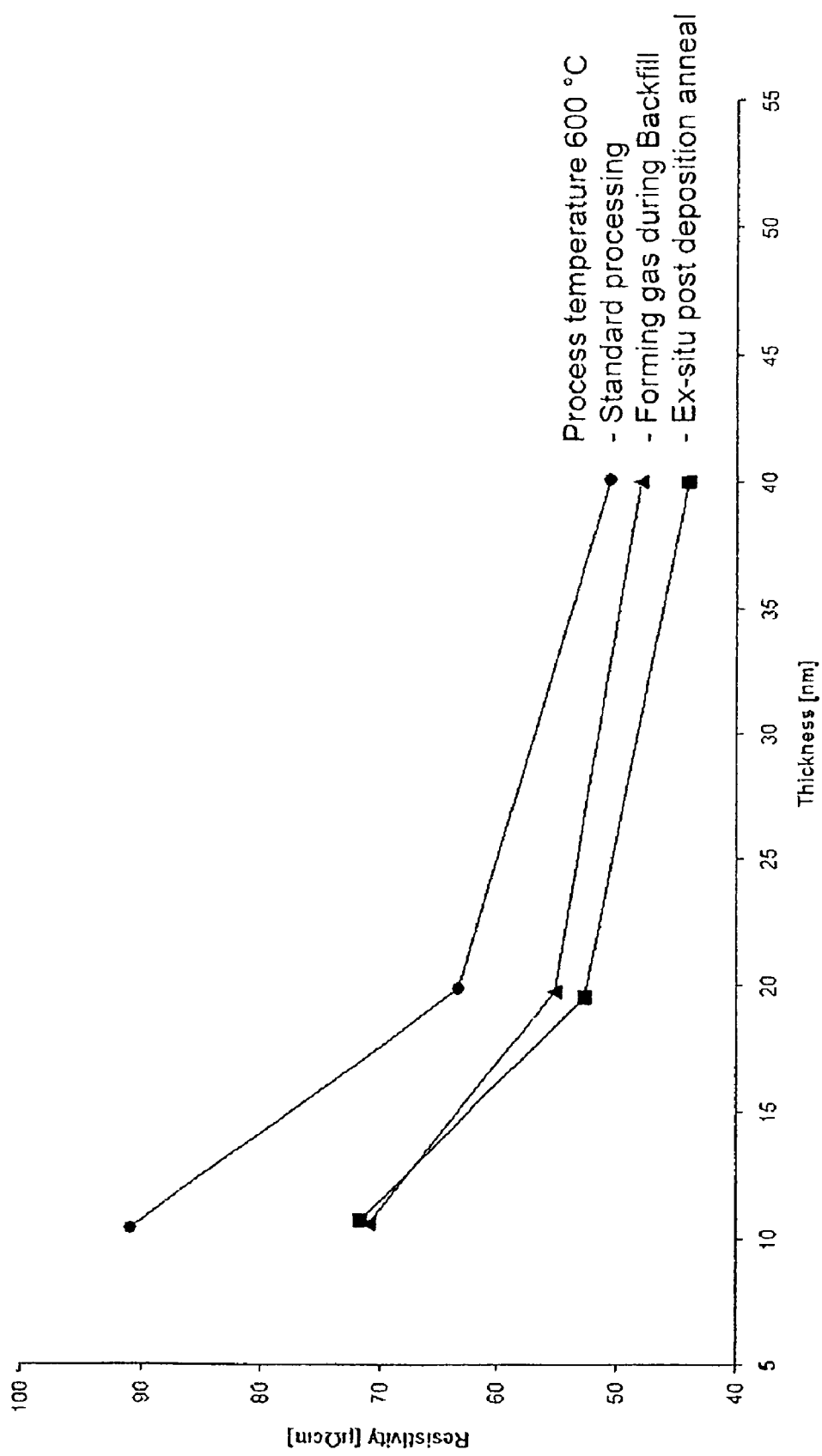
FIG. 4 is a graph comparing the resistivities of titanium nitride films processed under different conditions, according to some embodiments of the invention.

With reference to FIG. 4, the resistivities of the various films were subsequently measured. For all film thicknesses, the graph illustrates that standard post-deposition processing, in which no reducing agent was provided during backfill and in which a post-deposition anneal was not performed, undesirably resulted in titanium nitride films having a significantly higher resistivity than titanium nitride films processed using the other post-deposition methods tested.

As a reference, the skilled artisan will understand that an ex-situ post deposition anneal in a reducing gas can reduce the resistivities of deposited films. This is evident in FIG. 4, in which the results for the ex-situ post deposition anneal show a decrease in resistivity of about 20 $\mu\Omega\cdot cm$ for the thinnest films and about 10 $\mu\Omega\cdot cm$ for the thickest films, relative to the standard process without an ex-situ post deposition anneal.

Advantageously, it was found that flowing the reducing gas into the deposition chamber during the backfill and cool-down gave resistivity results similar to those resulting from an ex situ anneal in a reducing gas. At a thickness of 10 nm, the resistivity was about 70 $\mu\Omega\cdot cm$, which was slightly less than the result for the films subjected to the ex situ anneal. At thicknesses of 20 nm and 40 nm, the resistivities were less than 60 $\mu\Omega\cdot cm$ and less than 50 $\mu\Omega\cdot cm$, respectively. Thus, particularly, for thin films of about 40 nm or less, or about 20 nm or less, a backfill and cool-down using a reducing gas achieves resistivity results similar to that achieved by an ex-situ post deposition anneal. This indicates that the ex-situ anneal can be omitted, thereby reducing processing steps and increasing throughput in the production of conductive films, such as metal nitride, or transition metal nitride films.

It will be appreciated that, while advantageously applied to the context of a post deposition backfill, the present teachings can be applied to various other contexts. For example, where the deposition is performed at a relatively low temperature, the deposition temperature and unloading temperature might be equal, omitting the need for reducing the temperature after deposition. Nevertheless, flowing reducing gas into the deposition chamber provides benefits for suppressing oxidation when the chamber is backfilled and the substrates are prepared for unloading from the deposition chamber.

Accordingly, it will be apparent to those skilled in the art that various modifications and variations can be made in the present invention without departing from the scope or spirit of the invention. Thus, it is intended that the present invention cover the modifications and variations of this invention provided that they come within the scope of the appended claims or their equivalents.

What is claimed is:

1. A method for producing a transition metal nitride film, comprising:
    providing a substrate in a chemical vapor deposition (CVD) chamber;
    depositing a transition metal nitride film on the substrate in the CVD chamber at a deposition pressure and a deposition temperature;
    subsequently increasing pressure in the CVD chamber from the deposition pressure to an unloading pressure by flowing a reducing gas into the CVD chamber, the reducing gas comprising an inert gas and a reducing agent;
    reducing a temperature of the substrate from the deposition temperature to an unloading temperature while increasing the pressure in the CVD chamber; and
    unloading the substrate from the CVD chamber at the unloading pressure and at the unloading temperature.

2. The method of claim 1, wherein the deposition pressure is less than about 100 Torr.

3. The method of claim 2, wherein the deposition pressure is less than about 10 Torr.

4. The method of claim 1 wherein the unloading pressure is about atmospheric pressure.

5. The method of claim 1, wherein the deposition temperature is about 500° C. or more.

6. The method of claim 5, wherein the unloading temperature is about 400° C. or less.

7. The method of claim 1, wherein the transition metal nitride has a thickness of less than about 100 nm.

8. The method of claim 7, wherein the transition metal nitride has a thickness of less than about 40 nm.

9. The method of claim 1, wherein the reducing agent comprises $H_2$.

10. The method of claim 1, wherein a concentration of the reducing agent in the CVD chamber is about 4 vol. % or less.

11. The method of claim 1, wherein the transition metal nitride comprises titanium nitride.

12. The method of claim 1, wherein the CVD chamber comprises a vertical batch reactor configured for processing 25 or more substrates.

13. The method of claim 1, wherein the flow of the reducing gas is initiated after depositing the transition metal nitride film.

14. A method for semiconductor processing, comprising:
    providing a substrate in a deposition chamber;
    depositing a conductive film on the substrate in the chamber at a deposition pressure;
    subsequently increasing the pressure in the chamber by flowing a reducing gas into the chamber, wherein the reducing gas comprises an inert gas and a reducing agent, and wherein the amount of the reducing agent in the chamber is smaller than the amount of the inert gas; and
    unloading the substrate from the chamber at the unloading pressure, wherein the unloading pressure is about atmospheric pressure.

15. The method of claim 14, wherein the deposition pressure is less than about 100 Torr.

16. The method of claim 15, wherein the deposition pressure is less than about 10 Torr.

17. The method of claim 14, wherein the conductive film comprises a transition metal nitride or silicon.

18. The method of claim 17, wherein the conductive film of the unloaded substrate has a resistivity of less than about 80 $\mu\Omega\cdot cm$.

19. The method of claim 17, wherein the conductive film has a thickness of about 100 nm or less.

20. The method of claim 14, wherein the reducing agent is selected from the group consisting of $H_2$, methanol, ethanol, propanol, isopropyl alcohol and mixtures thereof.

21. The method of claim 14, wherein the reducing agent constitutes about 4 vol. % or less of the total volume of gas in the chamber.

22. The method of claim 14, wherein the reducing agent constitutes about 2 vol. % or less of the total volume of gas in the chamber.

23. The method of claim 14, wherein depositing the film comprises performing a chemical vapor deposition process.

24. A method for producing a transition metal nitride film, comprising:
    providing a substrate in a chemical vapor deposition (CVD) chamber;

depositing a transition metal nitride film on the substrate in the CVD chamber at a deposition pressure and a deposition temperature;

subsequently increasing pressure in the CVD chamber from the deposition pressure to an unloading pressure by flowing a reducing gas into the CVD chamber, the reducing gas comprising an inert gas and a reducing agent; and unloading the substrate from the CVD chamber at the unloading pressure and at the unloading temperature, wherein the unloading pressure is about atmospheric pressure.

* * * * *